United States Patent [19]

Natori et al.

[11] 4,199,772
[45] Apr. 22, 1980

[54] SEMICONDUCTOR MEMORY DEVICE

[75] Inventors: Kenji Natori, Kamakura; Fujio Masuoka, Yokohama, both of Japan

[73] Assignee: Tokyo Shibaura Electric Co., Ltd., Japan

[21] Appl. No.: 847,542

[22] Filed: Nov. 1, 1977

[30] Foreign Application Priority Data

Nov. 17, 1976 [JP] Japan .................. 51-138180

[51] Int. Cl.$^2$ .................................. H01L 29/78
[52] U.S. Cl. ........................... 357/23; 357/41; 357/55; 357/14
[58] Field of Search ............ 357/23, 41, 55, 14

[56] References Cited

U.S. PATENT DOCUMENTS

| | | | |
|---|---|---|---|
| 3,825,945 | 7/1974 | Masouka | 357/23 |
| 3,893,155 | 7/1975 | Ogiue | 357/42 |
| 3,975,221 | 8/1976 | Rodgers | 148/191 |
| 4,003,036 | 1/1977 | Jenne | 340/173 R |
| 4,012,757 | 3/1977 | Koo | 357/24 |
| 4,017,883 | 4/1977 | Ho | 357/24 |
| 4,084,175 | 4/1978 | Ouyang | 357/55 |

*Primary Examiner*—Martin H. Edlow
*Attorney, Agent, or Firm*—Finnegan, Henderson, Farabow, Garrett & Dunner

[57] ABSTRACT

A semiconductor memory device in which a plurality of unit memory cells are formed on a semiconductor substrate; each memory cell comprises a main electrode region provided with either of the source and drain sections of an MOS transistor, a gate region and an MOS capacitor region, the main electrode region, gate region and capacitor region being arranged in the order mentioned; a recess is formed in a semiconductor region including the gate region and part of the MOS capacitor region; the gate region is formed in one selected portion of the recess-defining wall body; and part of the capacitor electrode of the capacitor region extends over another selected portion of the recess-defining wall body.

11 Claims, 27 Drawing Figures

F I G. 13
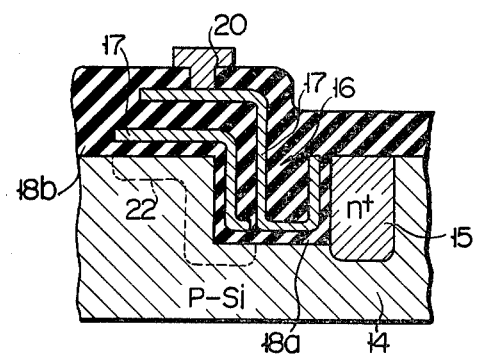
F I G. 14
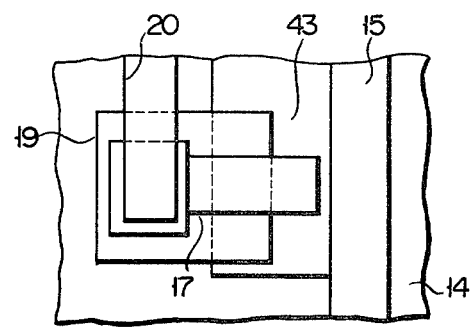
F I G. 15
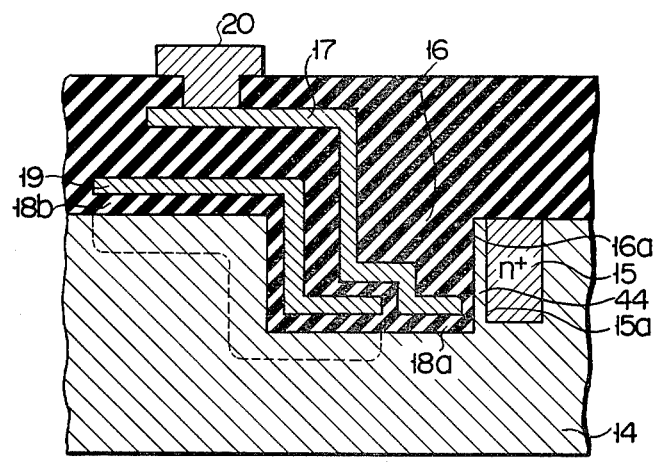
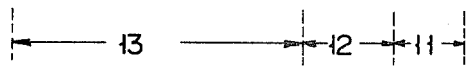

SEMICONDUCTOR MEMORY DEVICE

BACKGROUND OF THE INVENTION

This invention relates to a semiconductor memory device whose unit memory cell is formed of an MOS transistor comprising a main electrode region, gate region and capacitor region arranged in the order mentioned.

High integration, high performance and low power consumption are demanded of a memory device constituted by a large number of integrated MOS transistors. A semiconductor memory device whose unit memory cell comprises a main electrode region, gate region and capacitor region arranged in the order mentioned and which is designed to act as a random access memory (hereinafter abbreviated as "RAM") has been known to be preferred as an element for meeting the aforesaid requirements.

For further development of a memory device whose unit memory cell is constructed as described above, it is necessary to carry out higher integration, than has been possible in the past, suppress a short channel effect arising from the unavoidable shortening of the channel of individual MOS transistors integrated with higher density, and increase the capacitance of the capacitor region. As used herein, the term "short channel effect" is defined to mean that where the MOS transistor is made compact, its channel is naturally shortened, resulting in an increase or decrease in gate threshold voltage. The short-channel effect is known to arise from the irregular distribution of an electric field in the gate region. Particularly where the short channel effect is of the type which tends to decrease the gate threshold voltage, then the difficulties occur in that undesirable conduction appears in the gate region or a charge stored in the capacitor of the capacitor region is likely to be lost. Further, where an attempt is made to narrow an area occupied by the MOS transistor by decreasing an area occupied by a capacitor electrode in the capacitor region, or to preserve a required amount of capacitance in the capacitor region by reducing the thickness of an insulation layer formed between the capacitor electrode and semiconductor substrate, then it is impossible to obtain the desired characteristics of insulation and withstand voltage.

For better understanding of this invention, there will now be described by reference to FIG. 1 the construction of the prior art MOS transistor used as a unit memory cell which comprises a main electrode region, gate region and capacitor region arranged in the order mentioned.

Referring to FIG. 1 illustrating the construction of the conventional MOS transistor Q, a main electrode region 1, gate region 2 and capacitor region 3 are formed in the order mentioned as viewed in the horizontal direction. Namely, an N+ semiconductor layer 5 constituting a drain region is formed on a P type silicon substrate 4 to be used as a digit line. In the gate region 2, a gate electrode 7 prepared from polycrystalline silicon is formed above the substrate 4 with a gate insulation layer 6 interposed therebetween. The capacitor region 3 corresponds to the source region of the ordinary MOS transistor. Provided above the capacitor region 3 is a capacitor electrode 9 with an insulation layer 8 deposited therebetween. The capacitor electrode 9 causes an inverted layer appearing on a depletion layer 4a occurring in the upper surface portion of the substrate 4 to constitute a capacitor C acting as the other electrode. Numeral 10 denotes an aluminium wire electrically connected to the gate electrode 7 to be used as a word line. FIG. 2 shows an equivalent circuit arrangement of, for example, the MOS transistor Q. This MOS transistor Q is formed of a main electrode region 1, gate region 2 and capacitor region 3 simply arranged in the horizontal direction. Where, therefore, an attempt is made to increase the capacitance of the capacitor region 3, it is necessary to enlarge an area occupied by the capacitor region 3 or reduce the thickness of the insulation layer 8. However, the enlargement of the area of the capacitor region 3 obstructs the high integration of a large number of unit memory cells. The decrease of the thickness of the gate insulation layer 6 presents difficulties in ensuring the characteristics of insulation and withstand voltage. Further, the shortening of the channel of the MOS transistor Q shown in FIG. 1 makes it difficult to provide the uniform distribution of an electric field below the channel of the MOS transistor Q, thus rendering the suppression of the short channel effect also difficult.

It is accordingly the object of this invention to provide a semiconductor memory device which enables the unit memory cell to maintain a desired MOS capacitance even when the unit memory cell is reduced in area, and moreover can effectively prevent the short-channel effect.

SUMMARY OF THE INVENTION

The semiconductor memory device of this invention is formed of a plurality of unit memory cells, in each of which a main electrode region provided with either of the source and drain of an MOS transistor, the gate region of the MOS transistor and an MOS capacitor region are arranged in the horizontal direction in the order mentioned. A recess is formed in a semiconductor substrate including the gate region and part of the MOS capacitor region. The gate region is formed in one selected portion of the recess-defining wall body. Part of the MOS capacitor electrode provided in the capacitor region extends to another selected portion of the recess-defining wall body.

With the semiconductor memory device of this invention, the MOS capacitor electrode is allowed to have a large area without increasing the area of the unit memory cell. Namely, where the MOS capacitor is desired to have a prescribed capacitance, the area of the MOS transistor can be decreased. Further, provision of the gate region in the recess more reduces the short channel effect with the resultant decline in the gate threshold voltage than has been possible with the prior art semiconductor memory device. Obviously, this invention is applicable in many modifications.

BRIEF DESCRIPTION OF THE DRAWING

FIG. 13 is a sectional view of a unit memory cell according to a tenth embodiment of the invention which constitutes a semiconductor memory device;

FIG. 14 is a plan view of the upper part of a unit memory cell according to an eleventh embodiment of the invention which constitutes a semiconductor memory device; and FIG. 15 is a sectional view of a unit memory cell according to a twelfth embodiment of the invention which constitutes a semiconductor device.

DETAILED DESCRIPTION OF THE PREFERRED EMBODIMENTS

Figure 1:
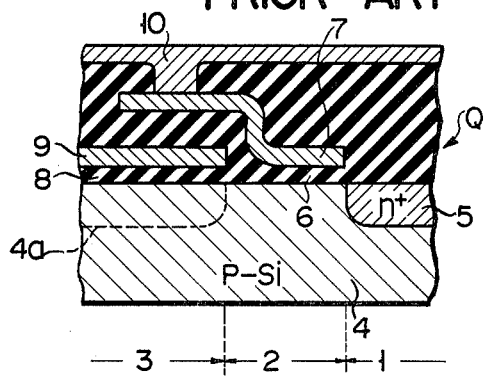
FIG. 1 is a sectional view of the prior art unit memory cell.
Figure 2:
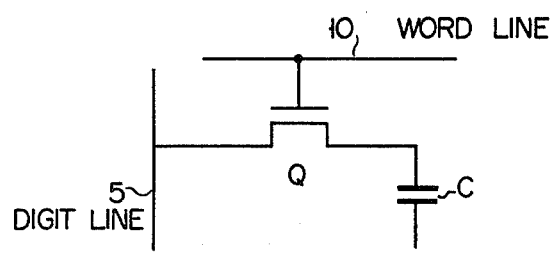
FIG. 2 is an equivalent circuit diagram of the unit memory cell of FIG. 1.
Figure 3A:
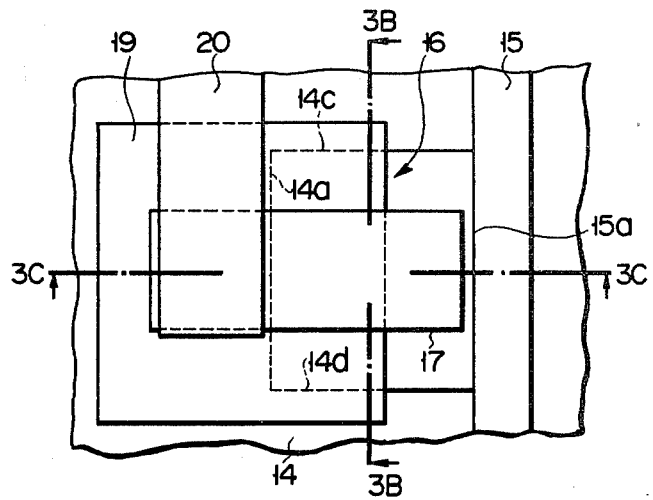
FIG. 3A is a plan view of the upper part of a unit memory cell according to a first embodiment of this invention which is included in a semiconductor memory device with an electrical insulation layer on the upper part taken off.
Figure 3B:
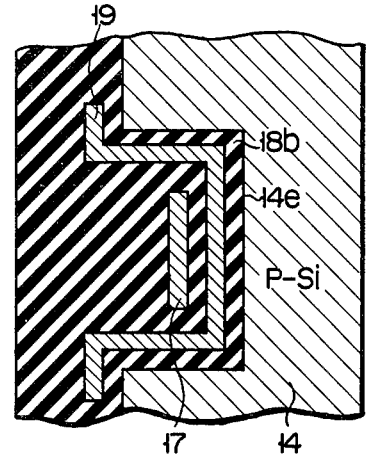
FIG. 3B is a sectional view on line 3B—3B of FIG. 3A.
Figure 3C:
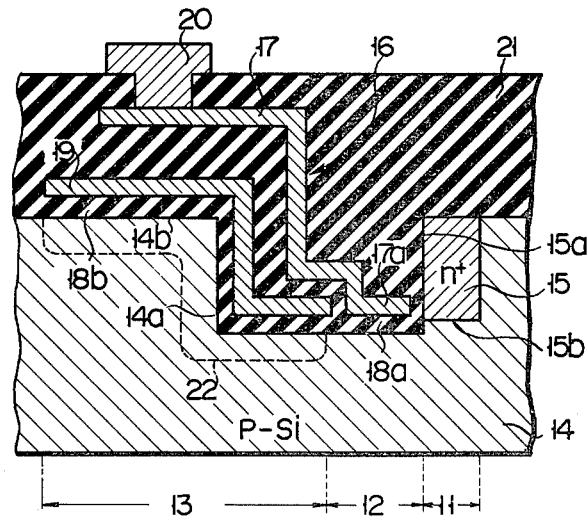
FIG. 3C is a sectional view on line 3C—3C of FIG. 3A.

As seen from the sectional view of FIG. 3C, the main electrode region 11, gate region 12 and capacitor region 13 of the unit memory cell of this invention are arranged in the horizontal direction in the order mentioned. The unit memory cell is arranged, for example, on a P type silicon semiconductor substrate 14 of a first conductivity type. The main electrode region 11 includes a semiconductor layer 15 of a second N+ conductivity type. A recess 16 is provided in the semiconductor substrate 14 in adjacent relationship to the left side 15a of the N+ type semiconductor layer 15. The recess 16 is defined by the vertical wall 15a of the N+ semiconductor layer 15 and the vertical walls 14a, 14c, 14d of the P type silicon semiconductor substrate 14 and the bottom wall 14e of the recess 16. The end portion 17a of a gate electrode 17 provided in the recess 16 is disposed above that portion of the bottom wall 14e of the recess 16 which lies adjacent to the vertical wall 15a of the n+ semiconductor layer 15 with a gate insulation layer 18a interposed between said end portion 17a and bottom wall 14e. The end portion 17a of the gate electrode 17, insulation layer 18a and semiconductor substrate 14 jointly form the gate region 12. In the capacitor region 13, a capacitor electrode 19 is formed so as to extend along the selected portions of the horizontal upper side 14b of the semiconductor substrate 14 which does not constitute one of the walls of the recess 16 and the recess-defining vertical walls 14a, 14c, 14d of the semiconductor substrate 14 with an electrical insulation layer 18b interposed between said capacitor electrode 19 and the above-mentioned walls. The capacitor electrode 19 forms the desired capacitor with an inverted layer formed on the depletion layer 22 used as the other electrode. This inverted layer acts as the source of the MOS transistor. Part of the gate electrode 17 extends along the horizontal portion of the capacitor electrode 19. An aluminium line 20 serving as a word line is connected to the proximity of the end of the extension of the gate electrode 17. The n+ semiconductor layer 15 acting as a digit line extends in a direction perpendicular to the surface of the drawing. Referential numeral 21 is an electrically insulated protective layer. As seen from FIG. 3A, the aluminium word line 20 is connected in common to gate electrodes 17 of plural unit memory cells. The n+ semiconductor layer 15 is also provided in common to the plural unit memory cells. As apparent from FIGS. 3A and 3B, the recess 16 has a substantially rectangular cross section. The capacitor electrode 19 extends (as best shown in FIG. 3B) along those of the four vertical walls defining the recess 16 which are indicated in dotted lines and also along those portions of the bottom of the recess 16 which correspond to said dotted line portions. Namely, the capacitor electrode 19 is allowed to have a considerably larger area than in the prior art semiconductor memory device. Obviously, based on the same capacitance of the capacitor region 13, the unit memory cell according to the first embodiment of this invention is more reduced in area than in the prior art. As seen from FIG. 3C, the bottom 15b of the n+ semiconductor layer 15 is positioned slightly above the bottom of the recess 16. This arrangement is effective to render those portions of the isopotential lines which lie immediately below the bottom of the recess 16 parallel with each other as later described by reference to FIG. 4B, thereby suppressing the short channel effect on the gate region 12. For this object, however, the bottom 15b of the n+ semiconductor layer 15 need not take the above-mentioned position, but may be on the same level as the bottom of the recess 16. Even this modification can more effectively eliminate the short-channel effect than the prior art MOS transistor.

Figure 4A:
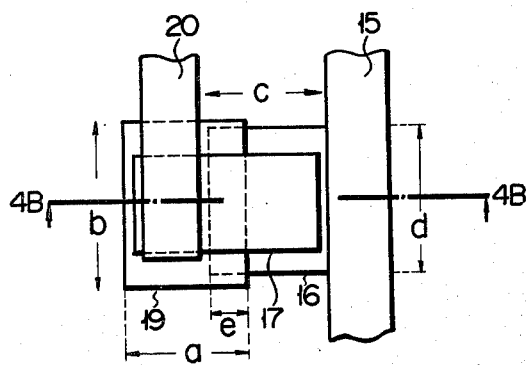
FIG. 4A is a plan view of the upper part of a unit memory cell according to a second embodiment of the invention which is included in a semiconductor memory device.
Figure 4B:
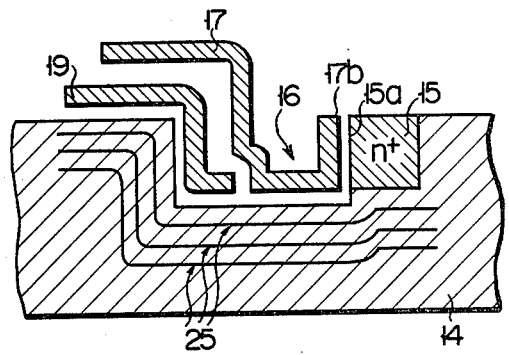
FIG. 4B is a sectional view on line 4B—4B of FIG. 4A, indicating the isopotential planes below the gate region, with the word line and electrical insulation layer omitted.

The unit memory cell of FIGS. 4A and 4B according to the second embodiment of this invention is of substantially the same construction as that of FIGS. 3A to 3C according to the first embodiment. The same or similar parts of FIGS. 4A and 4B as those of FIGS. 3A to 3C are denoted by the same numerals, description thereof being omitted. The plan view of the unit memory cell shown in FIG. 4A only differs from FIG. 3A in that notations denoting the concrete measurements of the unit memory cell are given. FIG. 4B is a sectional view on line 4B—4B of FIG. 4A, the insulation layers 18a, 18b, 21 and aluminium word line 20 being omitted. FIG. 4B presents isopotential lines 25 below the channel region. The second embodiment of FIG. 4A differs from the first embodiment of FIG. 3A in that part 17b of that end portion of the gate electrode 17 which is received in the recess 16 extends, as shown in FIG. 4B, parallel with the vertical wall 15a of the n+ semiconductor layer 15. The measurements of the unit memory cell denoted by the notations a to e given in FIG. 4A will be later described.

Figure 5A:
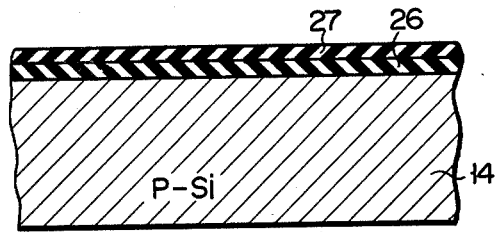
FIGS. 5A to 5H illustrate the sequential steps of manufacturing the unit memory cell of FIGS. 4A and 4B.
Figure 5B:
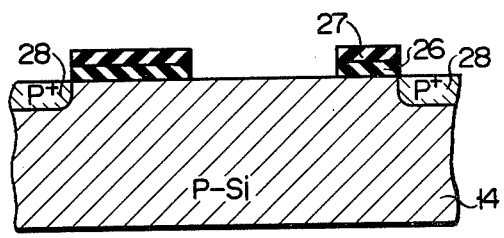
Figure 5C:
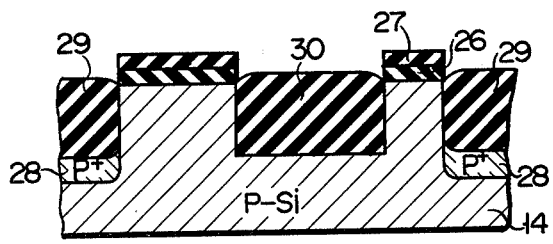
Figure 5D:
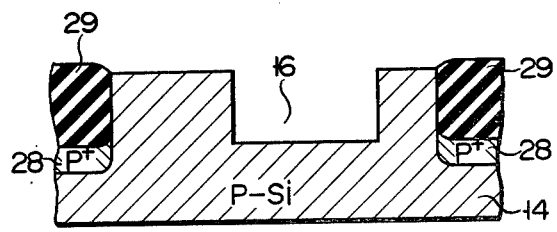
Figure 5E:
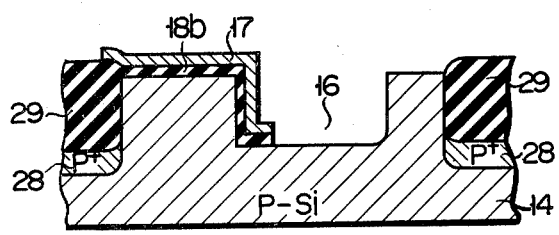
Figure 5F:
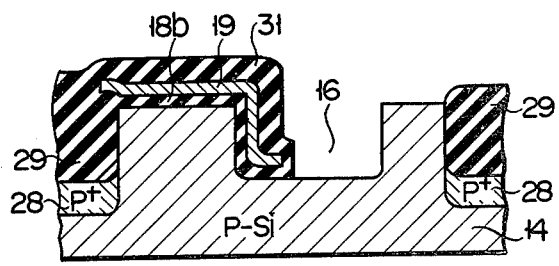
Figure 5G:
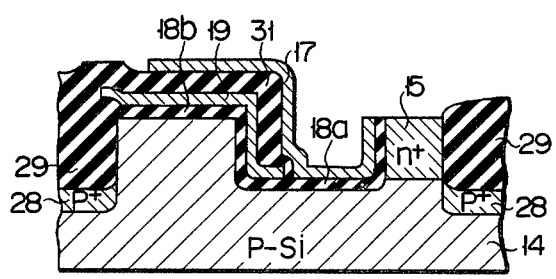
Figure 5H:
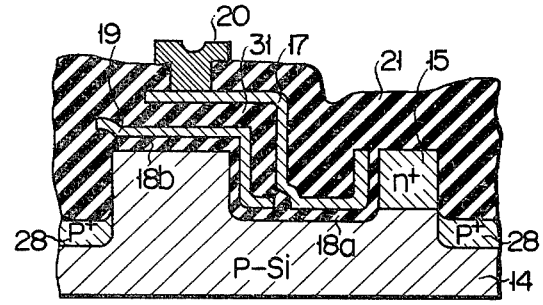

There will now be described by reference to FIGS. 5A to 5H the sequential steps of manufacturing an example of the unit memory cell of FIGS. 4A and 4B. Referring to FIG. 5A, an SiO$_2$ layer 26 and Si$_3$N$_4$ layer 27 are deposited in turn on the surface of the P type silicon substrate 14 containing an impurity at a concentration of about $2 \times 10^{15}$/cm$^3$. In FIG. 5B, those portions of the SiO$_2$ layer 26 and Si$_3$N$_4$ layer 27 which correspond to a region lying outside of the region in which the desired unit memory cell is to be formed, that is, a field region and the region in which the recess 16 of the desired unit memory cell is to be provided are removed by photoetching. A P$^+$ layer 28 containing an impurity at a concentration of about $10^{18}$/cm$^3$ is diffused in those portions of the field region which were exposed by removal of the above-mentioned portions of the SiO$_2$ layer 26 and Si$_3$N$_4$ layer 27. In FIG. 5C, a recess 16 about 1.2 microns ($\mu$m) deep is formed by etching. SiO$_2$ layers 29, 30 about 2.0 microns are formed on the exposed portions of the semiconductor substrate 14. In FIG. 5D, the SiO$_2$ layer 30 is taken off, with the SiO$_2$ layers 29 retained, thereby exposing the recess 16. In FIG. 5E, the exposed portion of the semiconductor substrate 14 is oxidized to form an SiO$_2$ layer 18$b$ about 800 Å thick. A polycrystalline silicon layer 17 is deposited on the SiO$_2$ layer 18$b$. The unnecessary portion of the SiO$_2$ layer is etched off to provide an MOS capacitor region shown in FIG. 5E. In FIG. 5F, an SiO$_2$ layer 31 about 800 Å thick is formed all over the unit memory cell by chemical vapor deposition (abbreviated as "CVD"). Those portions of the surface of the SiO$_2$ layer 31 which lie on the drain and gate regions are etched off by photoetching to expose the corresponding semiconductor surface. In FIG. 5G, the exposed portions are oxidized to form an SiO$_2$ layer 18$a$ about 800 Å thick as a gate insulation layer. A polycrystalline silicon layer 17 is deposited on the SiO$_2$ layers 18$a$, 31. Only the required portions of the SiO$_2$ layer 18$a$ and polycrystalline layer 17 are indicated, the unnecessary portions thereof being removed by photoetching. An n$^+$ semiconductor layer 15 containing an impurity at a concentration of about $10^{20}$/cm$^3$ is formed by ion implantation. In FIG. 5H, a relatively thick SiO$_2$ layer 21 is formed all over the unit memory cell, and later bored with a contact hole. The aluminium word line 20 is connected to the gate electrode 17 through the contact hole.

FIG. 4A is a plan view of a unit memory cell prepared by the above-mentioned sequential steps. This unit memory cell has the following measurements. Namely, the capacitor electrode 19 has a size of $a \times b = 15$ $\mu$m $\times 15 \mu$m. The horizontal plane of the recess 16 has a size of $c \times d = 10 \mu m \times 12 \mu m$. That part of the capacitor electrode 19 which extends along the bottom of the recess 16 has a length e of 8 $\mu$m. Since the recess 16 is 1.2 $\mu$m deep as previously mentioned, the total effective area of the capacitor electrode 19 is 259 $\mu$m$^2$. About 34 $\mu$m$^2$ (about 13%) of the effective area is formed by the vertical walls of the recess 16. This arrangement contributes to the high integration of unit memory cells by reducing their areas.

Referring to FIG. 4B, those portions of the isopotential lines 25 which lie immediately below the gate region extend, as previously described, straightway almost parallel with each other. Where the channel of the ordinary MOS transistor is shortened, the isopotential lines are deformed, instead of extending linearly, thereby giving rise to the short-channel effect. However, the channel region of the semiconductor memory device of this invention has the same potential distribution (FIG. 4B) as the channel region of the long channel type MOS transistor, enabling the MOS transistor to be operated under a stable condition, and consequently unit memory cells to be integrated with high density by causing the MOS transistor to have a short channel.

With the present semiconductor memory device, the n$^+$ semiconductor layer 15 concurrently acting as a drain region and digit line is allowed to have a fully large thickness, thereby enabling the digit line to have a small resistance. This advantageous effect contributes to the quick and stable operation of the memory device.

The outline of the recess 16 (the section on line 3C—3C of FIG. 3A), the shapes of the gate electrode 17 and capacitor electrode 19 and the position of the aluminium word line 20 may be modified as shown in FIGS. 6 to 13. The same parts of FIGS. 6 to 13 as those of FIGS. 3A to 3C are denoted by the same numerals, description thereof being omitted.

Figure 6:
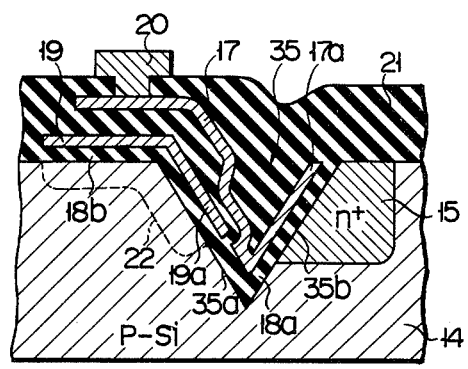
FIGS. 6 to 10 are sectional views of the unit memory cells according to third to seventh embodiments of the invention which respectively constitute a semiconductor memory device.

Referring to a unit semiconductor memory cell of FIG. 6 according to the third embodiment, a recess 35 is defined by four walls, one pair 35$a$, 35$b$ of which are so arranged as to have a V-shaped cross section, and the other pair (not shown) of which are set straight upward (parallel to the front and back sides of the drawing). That end portion 17$a$ of the gate electrode 17 which constitutes the gate region extends along the wall 35$b$ with the gate insulation layer 18$a$ interposed therebetween. The extension 19$a$ of the capacitor electrode 19 covers part of the wall 35$a$ and the other pair of vertical recess-defining walls with the insulation layer 18$b$ interposed therebetween.

Figure 7:
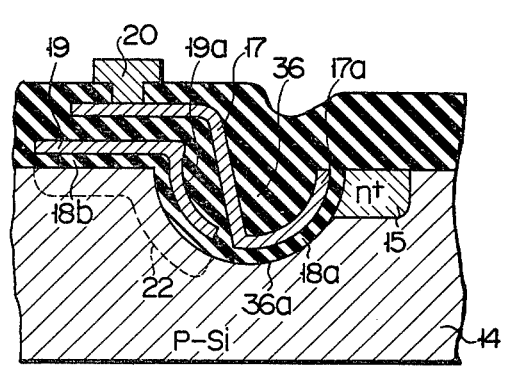

Referring to a unit semiconductor memory cell of FIG. 7 according to the fourth embodiment, a recess 36 is defined by a semicircular cylindrical wall body 36$a$, and two semicircular walls (not shown) perpendicularly intersecting said semicircular cylindrical wall body 36$a$ so as to close both openings thereof. The end portion 17$a$ of the gate electrode 17 extends along the right side (as indicated in FIG. 7) of said cylindrical wall body 36$a$ with the gate insulation layer 18$a$ interposed therebetween. The extension 19$a$ of the capacitor electrode 19 extends along the indicated left side of said semicircular cylindrical wall body 36$a$, and also along part of the paired semicircular vertical recess-defining walls.

Figure 8:
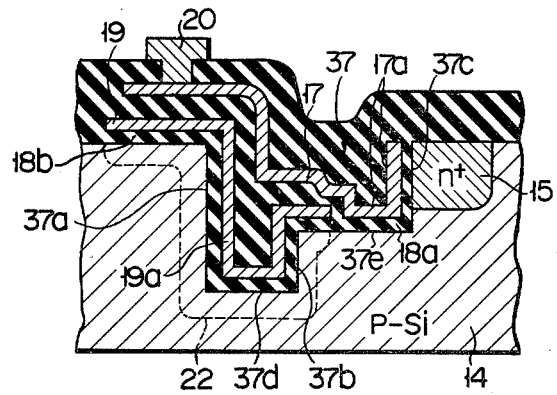

Referring to a unit semiconductor memory cell of FIG. 8 according to the fifth embodiment, a recess 37 is defined by the indicated vertical walls 37$a$ to 37$c$, bottom walls 37$d$, 37$e$ and two vertical walls (not shown) positioned parallel to the front and back sides of the drawing. That end portion 17$a$ of the gate electrode 17 which constitutes the gate region extends along part of the vertical wall 37$c$, and bottom wall 37$e$ with the gate insulation layer 18$a$ interposed between the end portion 17$a$ and the above-mentioned walls 37$c$, 37$e$. The extension 19$a$ of the capacitor electrode 19 extends along part of the vertical wall 37$a$, bottom wall 37$d$, vertical wall 37$b$ and bottom wall 37$e$, with the insulation layer 18$b$ disposed between the extension 19$a$ and the above-mentioned walls 37$a$, 37$d$, 37$b$, 37$e$, and also along part of the aforesaid two vertical recess-defining walls (not shown).

Figure 9:
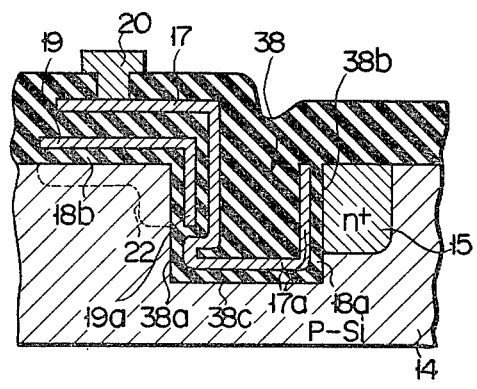

Referring to a unit semiconductor memory cell of FIG. 9 according to the sixth embodiment, a recess 38 is defined by vertical walls 38$a$, 38$b$, bottom wall 38$c$ and two vertical walls (not shown) positioned parallel to the front and back sides of the drawing. That end portion 17$a$ of the gate electrode 17 which constitutes the gate region extends along the vertical wall 38$b$ and bottom wall 38$c$, with the insulation layer 18$a$ provided between the end portion 17a and the above-mentioned walls 38b, 38c. The extension 19a of the capacitor electrode 19 extends along part of the vertical wall 38a with the insulation layer 18b formed therebetween and also part of the two vertical recess-defining walls (not shown).

Figure 10:
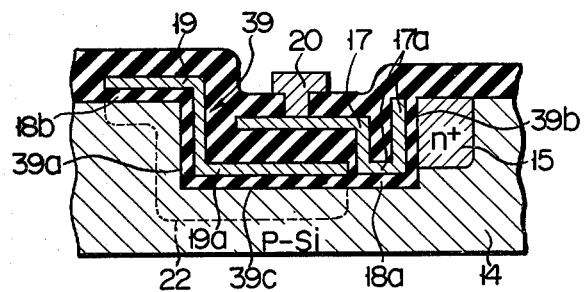

Referring to a unit semiconductor memory cell of FIG. 10 according to the seventh embodiment, a recess 39 is defined by vertical walls 39a, 39b and two vertical walls (not shown) positioned parallel to the front and back sides of the drawing. That end portion 17a of the gate electrode 17 which constitutes the gate region extends along part of the vertical wall 39b and bottom wall 39c, with the insulation layer 18a disposed therebetween. The extension 19a of the capacitor electrode 19 extends along part of the vertical wall 39a and the bottom wall 39c and also part of a pair of vertical recess-defining walls (not shown). The insulation layer 18b is provided between said extension 19a and the above-mentioned walls. The seventh embodiment of FIG. 10 is characterized in that the aluminium word line 20 contacts the gate electrode 17 in the upper part of the recess 39.

Figure 11A:
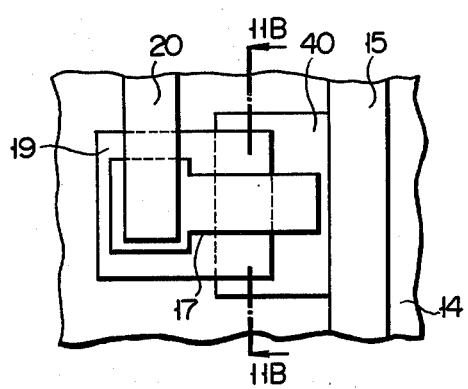
FIG. 11A is a plan view of the upper part of a unit memory cell according to an eighth embodiment which constitutes a semiconductor memory device.
Figure 11B:
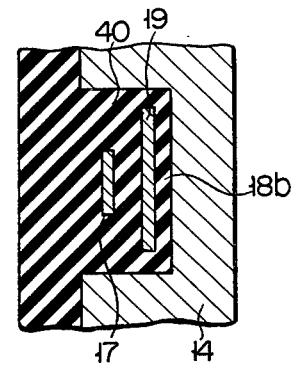
FIG. 11B is a sectional view on line 11B—11B of FIG. 11A.

The recess 40 of a unit semiconductor memory cell of FIG. 11 according to the eighth embodiment has exactly the same shape as the recess 16 of the first embodiment of FIGS. 3A to 3C. However, the eighth embodiment of FIG. 11 differs from the first embodiment in that the extension of the capacitor 19 extends along part of one of the vertical walls and part of the bottom wall of the recess 40.

Figure 12A:
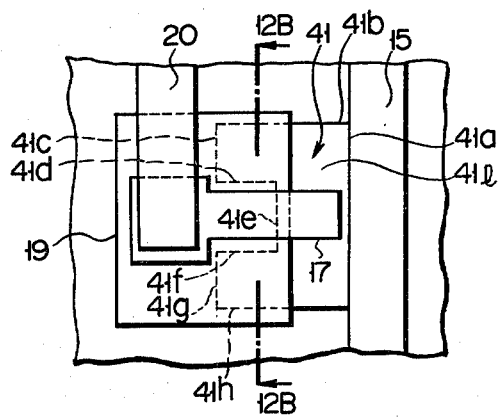
FIG. 12A is a plan view of the upper part of a unit memory cell according to a ninth embodiment of the invention which constitutes a semiconductor memory device.
Figure 12B:
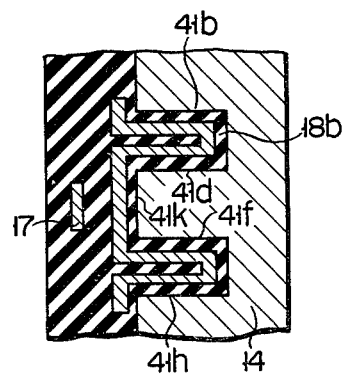
FIG. 12B is a sectional view on line 12B—12B of FIG. 12A.

The recess 41 of a unit semiconductor memory cell of FIGS. 12A, 12B according to the ninth embodiment is defined by vertical walls 41a to 41h, wall 41k and bottom wall 41l. That end portion of the gate electrode 17 which constitutes the gate region extends along part of the vertical wall 41a and bottom wall 41l with the insulation layer 18a (not shown) interposed between the end portion and the above-mentioned walls. The extension of the capacitor electrode 19 extends along part of the vertical walls 41b, 41h and bottom wall 41l and also along the vertical walls 41c, 41d, 41e, 41f, 41g, with the insulation layer 18b formed between said extension and the above-mentioned walls.

A unit semiconductor memory cell of FIG. 13 according to the tenth embodiment differs from the second embodiment of FIG. 5H in that the n+ semiconductor layer has a larger thickness than the depth of the recess 16. As previously described, it is preferred that the n+ semiconductor layer 15 should have a thickness smaller than or equal to the depth of the recess 16. However, it has been found that if the thickness of the n+ semiconductor layer 15 is made larger than the depth of the recess 16, insofar as those portions of the isopotential lines which lie immediately below the gate region can be kept linear, then the short channel effect can be more effectively suppressed than in the prior art semiconductor memory device.

With the first to the tenth embodiments, one recess is formed in each unit memory cell. However, as shown in FIG. 14 representing the eleventh embodiment, it is possible to provide a common recess 43 to a plurality of unit memory cells. In this case, the extension of the gate electrode 19 extends along one of the vertical walls defining the recess 43 and part of the bottom wall thereof.

With the first to the eleventh embodiments, the vertical wall 15a itself of the n+ semiconductor layer 15 included in the main electrode region 11 defined the recess. However, as shown in FIG. 15 indicating a unit memory cell according to the twelfth embodiment, it is possible to interpose a layer 44 of the same conductivity type as the semiconductor substrate 14 between the recess-defining wall 16a and the vertical wall 15a of the n+ semiconductor layer 15.

What we claim is:

1. A semiconductor memory device having a plurality of unit memory cells interconnected by word lines and digit lines, with each cell comprising:
   (a) a substrate of first conductivity type, said substrate including a planar first surface region and a second surface region which defines a recess in said first surface region;
   (b) a region of second conductivity type defining a first portion of said first surface region and extending into said substrate;
   (c) a capacitor insulating layer covering both a second portion of said first surface region and a contiguous first portion of said second surface region, said second surface region being interposed between said first and second portions of said first surface region;
   (d) a capacitor electrode provided on said capacitor insulating layer to convert said substrate adjacent said second portion of said first surface region and said first portion of said second surface region from said first conductivity type to said second conductivity type upon application of a voltge to said capacitor electrode;
   (e) a gate insulating layer covering a second portion of said second surface region; and
   (f) a gate electrode on said gate insulating layer and insulated from said capacitor electrode for connection to a word line of said semiconductor memory cell, said region of second conductivity type forming one of a source and drain of a metal oxide semiconductor transistor for connection to a digit line of said memory device, said gate insulating layer forming a gate of said transistor, and said substrate adjacent said capacitor insulating layer forming the other of said drain and source of said transistor; and said substrate adjacent said second portion of said first surface region and said first portion of said second surface region, said capacitor insulating layer, and said capacitor electrode forming a MOS capacitor.

2. The semiconductor memory device according to claim 1, wherein said second surface region, prior to application of a voltage to said capacitor electrode, is constituted entirely by part of said semiconductor substrate of said first conductivity type.

3. The semiconductor memory device according to claim 1, wherein said region of second conductivity type forms part of said second surface region and the remaining part of said second surface region is formed by said semiconductor substrate of said first conductivity type; and both said first and second portions of said second surface region are formed in said part of said second surface region constituted by said semiconductor substrate of said first conductivity type.

4. The semiconductor memory device according to claim 1, wherein one part of said second surface region is formed by part of said semiconductor substrate of said first conductivity type and the remaining part of said second surface region is constituted by part of said region of said second conductivity type; said second portion of said second surface region being constituted in part by said semiconductor substrate of said first conductivity type and at least in part by said region of said second conductivity type; and said second portion of said first surface region is constituted by said semiconductor substrate of said first conductivity type.

5. The semiconductor memory device according to claim 1, wherein a cross section of said recess defined by a vertical plane perpendicular to said first surface region is substantially rectangular.

6. The semiconductor memory device according to claim 1, wherein a cross section of said recess defined by a vertical plane perpendicular to said first surface region is substantially triangular.

7. The semiconductor memory device according to claim 1, wherein a cross section of said recess defined by a vertical plane perpendicular to said first surface region is substantially semicircular.

8. The semiconductor memory device according to claim 1, wherein said region of said second conductivity type extends a thickness into said substrate equal to or smaller than the depth of said recess.

9. The semiconductor memory device according to claim 1, wherein said recess is provided in each of the unit memory cells.

10. The semiconductor memory device according to claim 1, wherein a recess is provided in common to a plurality of said unit memory cells.

11. The semiconductor memory device according to claim 1, wherein said gate electrode lies within said recess.

* * * * *